United States Patent [19]
Rothman et al.

[11] Patent Number: 5,898,602
[45] Date of Patent: *Apr. 27, 1999

[54] CARRY CHAIN CIRCUIT WITH FLEXIBLE CARRY FUNCTION FOR IMPLEMENTING ARITHMETIC AND LOGICAL FUNCTIONS

[75] Inventors: Daniel J. Rothman, Sunnyvale; David Chiang, Saratoga, both of Calif.

[73] Assignee: Xilinx, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/591,841

[22] Filed: Jan. 25, 1996

[51] Int. Cl.⁶ .................................. G06F 7/38; G06F 7/50
[52] U.S. Cl. .................................. 364/716.01; 364/786.02
[58] Field of Search ........................ 364/716.06, 784.04, 364/786.02, 716.01

[56] References Cited

U.S. PATENT DOCUMENTS

| | | | |
|---|---|---|---|
| 5,274,581 | 12/1993 | Cliff et al. | 364/784 |
| 5,349,250 | 9/1994 | New | 364/784.04 |
| 5,481,486 | 1/1996 | Cliff et al. | 364/716.06 |

*Primary Examiner*—Tan V. Mai
*Attorney, Agent, or Firm*—Adam H. Tachner; Crosby, Heafey, Roach & May; Patrick T. Bever

[57] ABSTRACT

An improved arithmetic logic unit (ALU) of an erasable-programmable logic device (EPLD) with a flexible, programmable carry function allows a broad range of functions to be implemented. The inventive circuit utilizes a separately configurable carry chain with multiple logic and arithmetic function capabilities.

1 Claim, 10 Drawing Sheets

CARRY CHAIN CIRCUIT WITH FLEXIBLE CARRY FUNCTION FOR IMPLEMENTING ARITHMETIC AND LOGICAL FUNCTIONS

BACKGROUND OF THE INVENTION

1. Field of the Invention

The present invention relates generally to programmable logic devices, and more particularly to an improved programmable array logic-based erasable-programmable logic device (EPLD) including a flexible-function carry chain architecture.

2. Description of the Related Art

Basic PLDs (programmable logic devices) are based on a programmable logic array, normally composed of a specific number of input lines connected through a programmable array to the input terminals of a set of AND logic gates, the output terminals of which are in turn connected to the input terminals of a fixed or programmable array of OR gates. Devices are called PAL®-based when the programmable array logic includes a fixed OR array.

New kinds of erasable PAL-based devices (chips) have appeared in recent years, such as the XC7300™ EPLD family of devices, provided by Xilinx, Inc. having an address at 2100 Logic Drive, San Jose, Calif., that features on each chip a plurality of structurally and functionally identical function blocks and has a programmable interconnect resource which interconnects the function blocks. The interconnect resource in the XILINX device is designated the Universal Interconnect Matrix (UIM). Each function block on the chip includes a programmable AND array and several macrocells so that the block functions as a stand alone PAL. With an appropriate configuration, a block can be used in a manner logically separate from the rest of the chip or can be functionally integrated with the rest of the chip.

FIG. 1 illustrates in simplified form the architecture of the XILINX XC7236™ chip, a PAL-based EPLD. Four configurable function blocks FB1, FB2, FB3, FB4 are interconnected by a central UIM. Each of the four blocks FB1–FB4 receives input lines from the UIM, and connects by output lines to chip input/output pads I/O and/or back into the UIM. Blocks FB2, FB3, FB4 receive input lines coming from the I/O pads as well. Each block FB1–FB4 has carry-in and carry-out lines as well as shift-in and shift-out lines, with the "in" lines of each block being connected to the "out" lines of a previous block and the "out" lines of each block being connected to the "in" lines of a next block, forming loops as illustrated between the blocks. Each of the function blocks FB1–FB4 includes nine macrocells and a programmable AND array (an example of which is shown in FIG. 2) which is driven by the input lines from the UIM and input lines coming directly from the I/O pads. The XC7236 device thus contains 36 macrocells having identical structures.

FIG. 2 shows the schematic diagram of one of the macrocells FB1, and the AND array present in each function block of the XC7236 chip. Macrocells MC1–MC9 in the block (FIG. 2 shows MC1 only) are driven by the product terms (P-terms) derived from the programmable AND array AA2 in the same block. Five P-terms PP1–PP5, PP6–PP10 . . . PP41–PP45 are private to each of the nine macrocells in the block, while an additional twelve P-terms SP1–SP12 are shared among the nine macrocells in the block. Four of the private P-terms PP1–PP4 can be selectively (through programming of programmable switch elements SW1–SW4) logically ORed by gate OR1 together with up to four shared P-terms SP9–SP12 and drive the D1 data input terminal of an arithmetic logic unit ALU. The other data input terminal D2 of the ALU is driven by the output signal of gate OR2 which logically ORs the fifth private P-term PP5 and up to eight of the remaining shared P-terms SP1–SP8. The four private P-terms PP1–PP4 can be programmed for other purposes; for instance the private P-term PP1 can be used as a dedicated clock signal for the flip-flop FF; P-term PP2 can be the Output Enable signal OE; and the P-terms PP3 and PP4 can be the asynchronous SET S and RESET R signals, respectively, for the flip-flop FF.

The ALU can be placed into two modes, logic mode and arithmetic mode. In logic mode, the ALU is a 2-input function generator that can be programmed to generate any Boolean function of the output signals of logic gates OR1 and OR2 provided on data input terminals D1 and D2, respectively. In arithmetic mode, the ALU can be programmed to generate the arithmetic sum of two operands, combined with a carry signal coming from the next lower order macrocell. The arithmetically driven ALU also feeds a carry output signal $C_{out}$ to the ALU of the next higher order macrocell.

A logic block with macrocells of the kind shown in FIG. 2 is both complex and highly configurable and can implement a variety of logic functions by programming the configuration bits such as CB1–CB7, switches such as SW1–SW16, tri-state buffers such as TSB1 and TSB2, and multiplexers in the ALU. However, such high configurability requires a large number of logic gates in the speed path, thereby causing more propagation delay than might be desired. Also, delay caused by routing signals through the UIM between function blocks limits the speed of programmable devices. Thus, high speed and high flexibility/configurability of logic functions are generally in conflict with each other and must be traded off in such prior art devices.

Utilization Of The ALU

One possible path, therefore, for increasing device configurability without sacrificing speed is to improve the configurability of existing circuit elements. Many integrated circuit designs need to implement arithmetic as well as logic functions. In available non-programmable VLSI integrated circuit devices, such as Application Specific Integrated Circuits (ASICs), a series of single bit ALU's can be used to provide multi-bit wide ALU functionality. In these devices, a hard-wired carry function is used to provide an arithmetic carry when the ALU is being used in its arithmetic mode. The appropriate carry function for the specific design can thereby be provided, and wide non-arithmetic logic functions are simply built as necessary since there is little need for a flexible carry that can be used to carry logic functions as well as arithmetic functions.

In programmable devices, dual function carry is implemented, for example, via the dual function ALU illustrated in FIG. 3. The ALU of FIG. 3 is incorporated into the function block as shown in FIG. 2. FIG. 4 illustrates two ALUs implemented as programmable adder circuits. Note that carry blocks 10 include the carry circuitry shown in FIG. 3. Adder blocks 15 typically comprise programmable 2-bit function generators configured as XOR gates for completing the adder circuit, as shown, but are capable of reprogramming to any other basic 2-bit logic function.

Such an adder circuit can be designed into and implemented by the macrocells efficiently. Moreover, because adder logic is modular, each macrocell in a device can contain an identical programmable adder circuit. By passing carry information across adjacent macrocells, a fast and efficient adder chain may be implemented. Such blocks are useful for adders and comparator circuits, but have limited utility as functional logic due to their lack of full programmability.

Accordingly, there is a need in the industry for additional logic capability within macrocells to enable common functions other than adders to be implemented efficiently. In particular, because additional routing lines within a chip can increase chip size, it is desirable to have a programmable function that can implement adders and other functions while using only one set of lines to pass information between macrocells.

SUMMARY OF THE INVENTION

The present invention therefore provides a carry chain circuit for use in a programmable logic device circuit comprising a plurality of terminals for receiving at least two input bit signals (such as A and B) and a carry input (C), a first function generator connected to the terminals for generating a first output signal (S) which is a first selected function of at least signals A, B and C, and a second function generator connected to said terminals for generating a second output signal $C_1$ which is a second selected function of at least signals A, B and C.

Unlike the standard, hard-wired and function-specific carry element provided in the prior art, a flexible, multi-function, user selectable carry function is provided in the carry chain of the present invention. In one embodiment, these functions utilize the same input and output signals as the prior art carry block shown in FIG. 4, and are therefore backwardly compatible with existing circuit designs, but the input signals can also be processed differently. In particular, a programmable carry bit function generator is used to chain the solution of a given function from one macrocell to the next so that a wider logic function can be implemented without utilizing additional devices.

By decoupling the carry function selection ability from the ALU function selection ability, a broader range of arithmetic functions as well as more complex logic functions can be offered within a single device. Since a programmable part must adapt a fixed amount of circuitry to a broad range of problems, added functionality is an important advantage in the art. Complex functions can be cast as a group of smaller functions cascaded through the use of the improved programmable carry circuit. Once functions are recast in this way, logic that was previously difficult to fit in a given part can be implemented efficiently by using the carry chain as an extra path by which the functionality of a large group of macrocells can be tied together.

DETAILED DESCRIPTION OF THE PREFERRED EMBODIMENT

Figure 1:
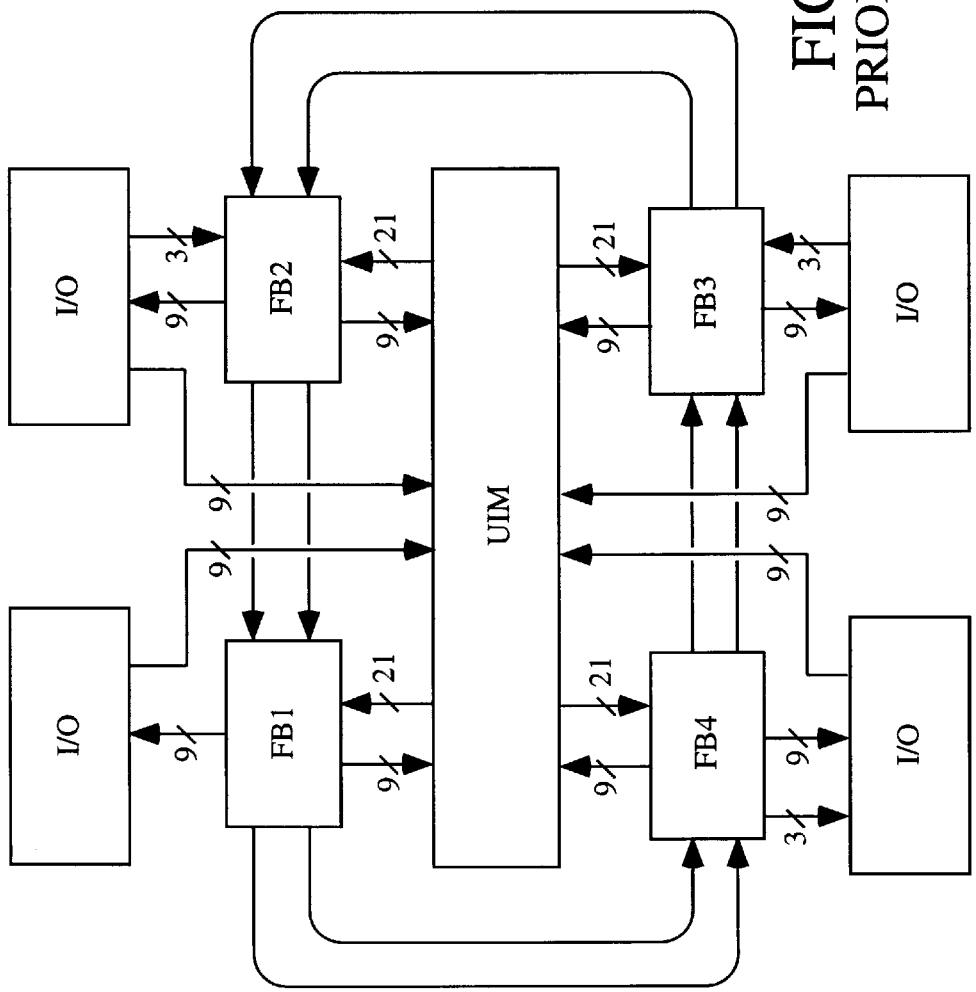
FIG. 1 is a simplified architecture of a PAL-based XC7236 chip, which has uniform function blocks.
Figure 2:
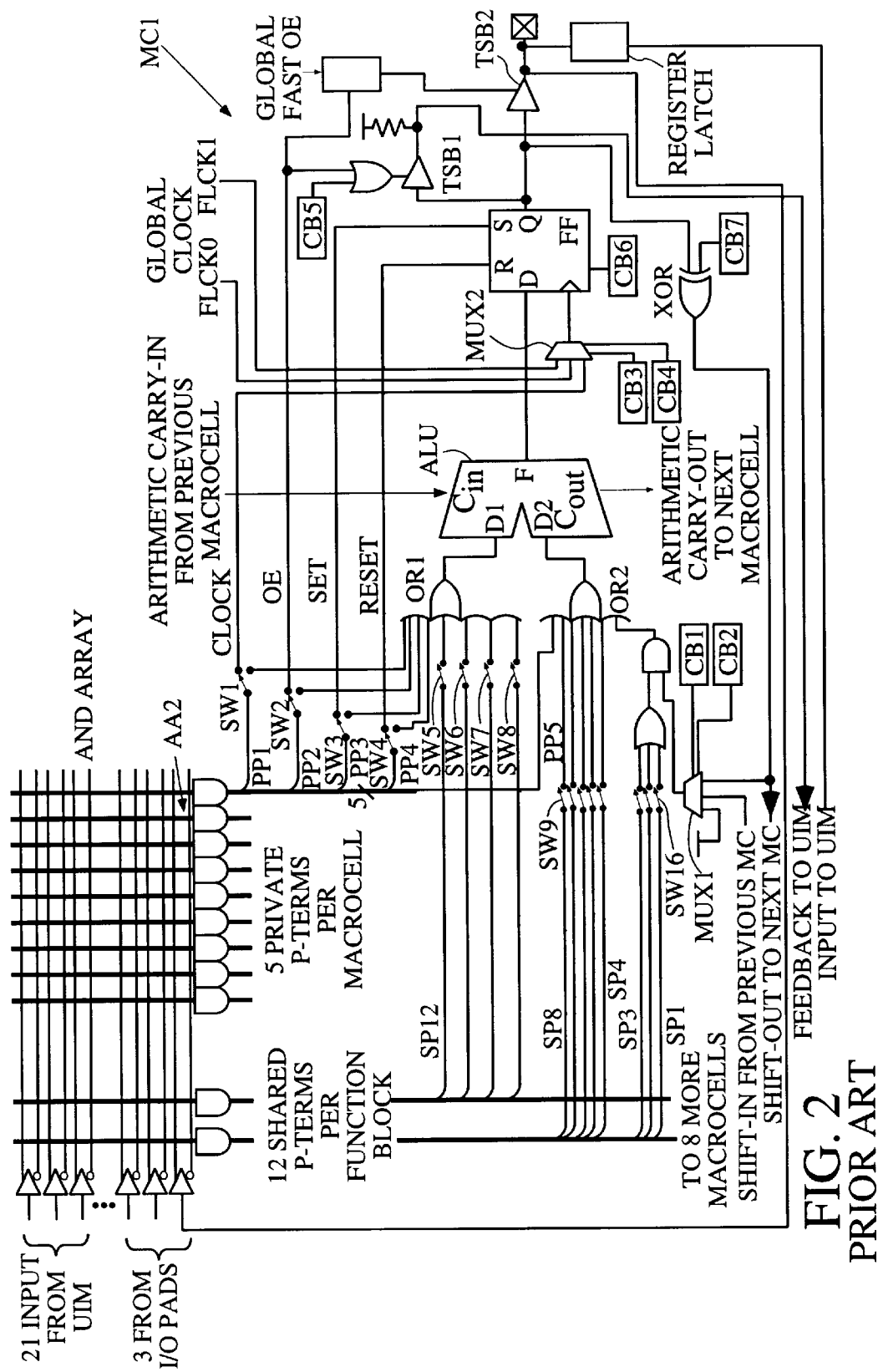
FIG. 2 is a schematic diagram of one of the macrocells and the programmable AND array in each block of the XC7236 chip.
Figure 3:
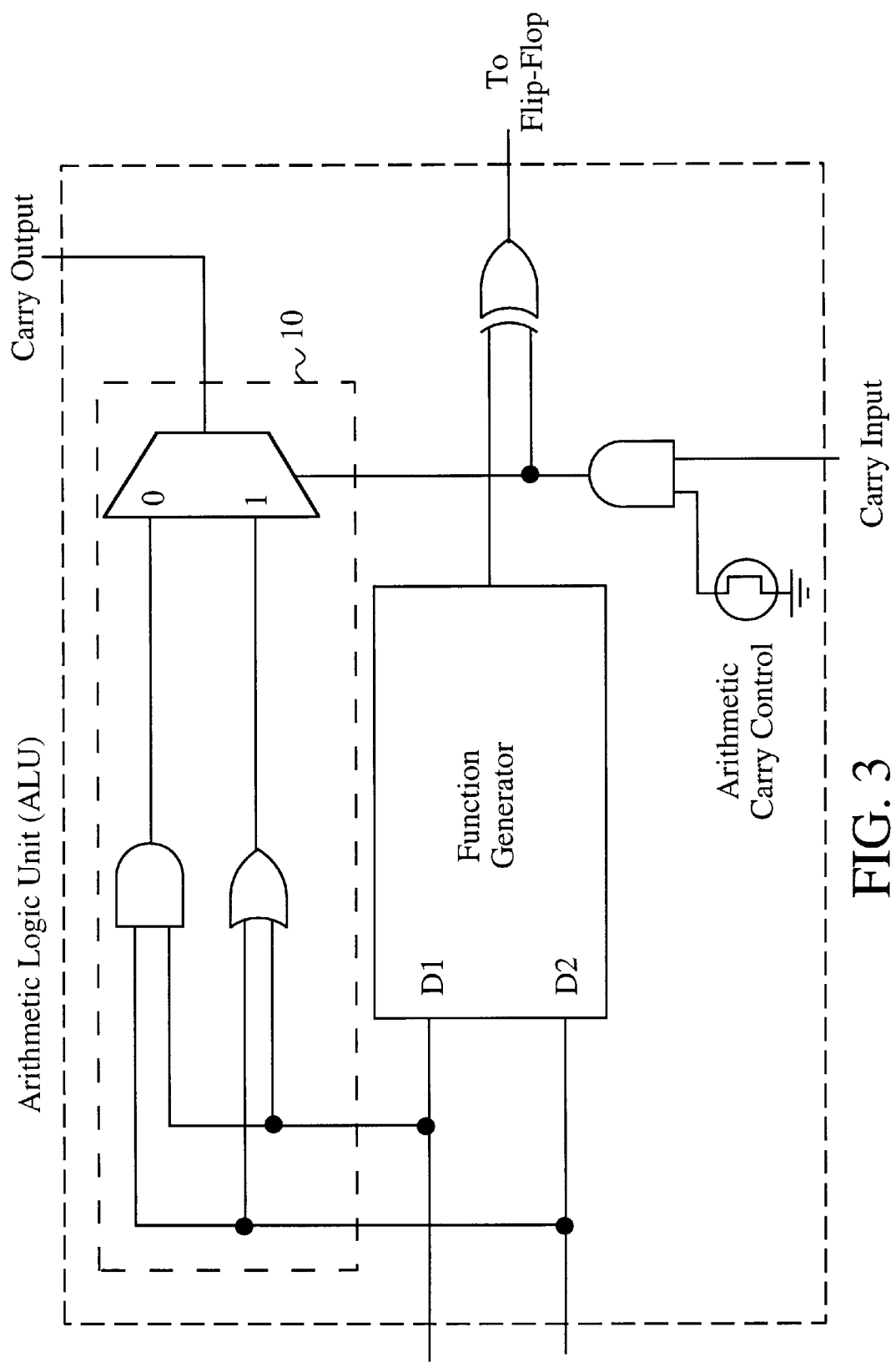
FIG. 3 is a detailed schematic diagram of the ALU shown in FIG. 2.
Figure 4:
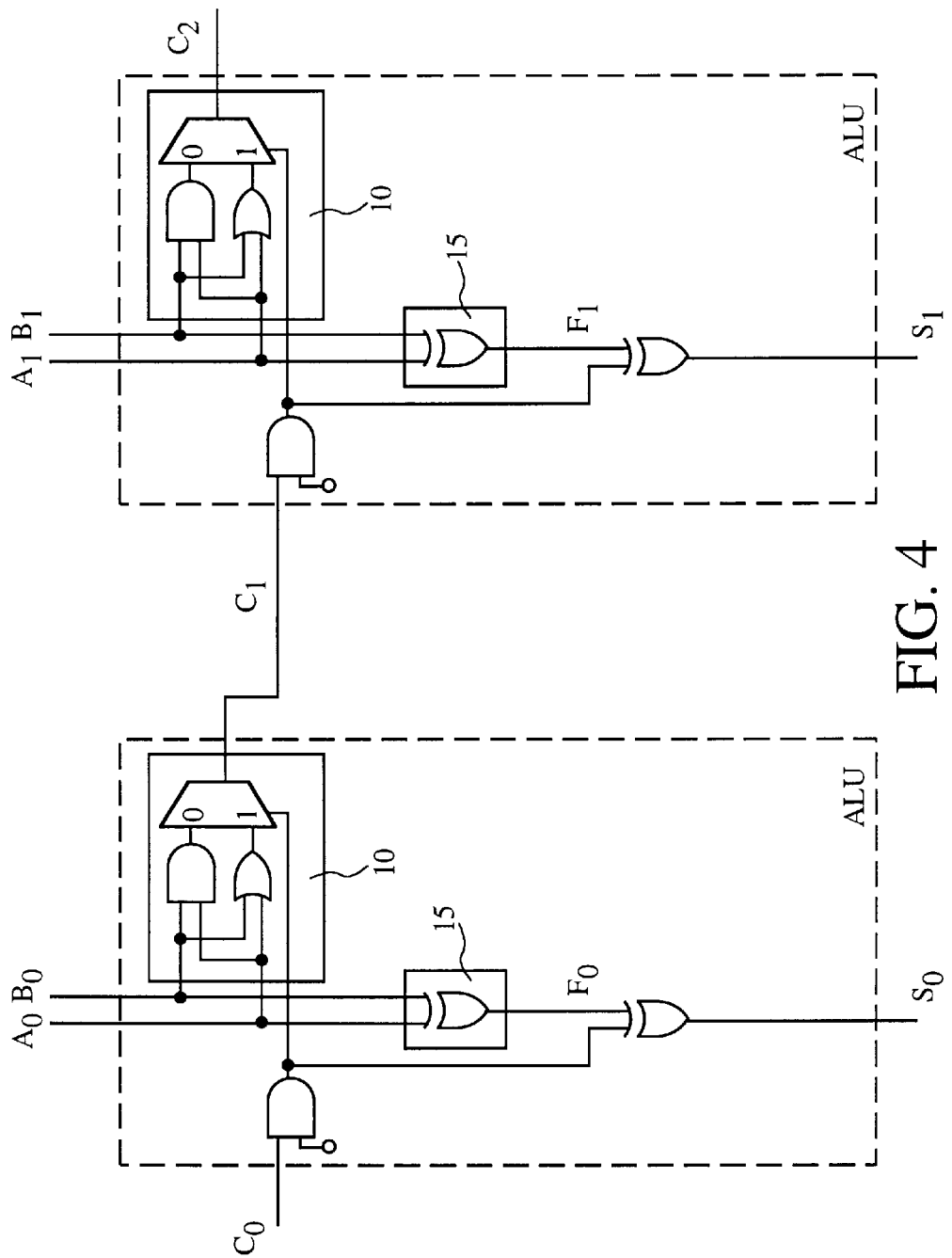
FIG. 4 is a simplified diagram of the circuit of a prior art carry chain circuit programmed to implement an adder function.
Figure 5:
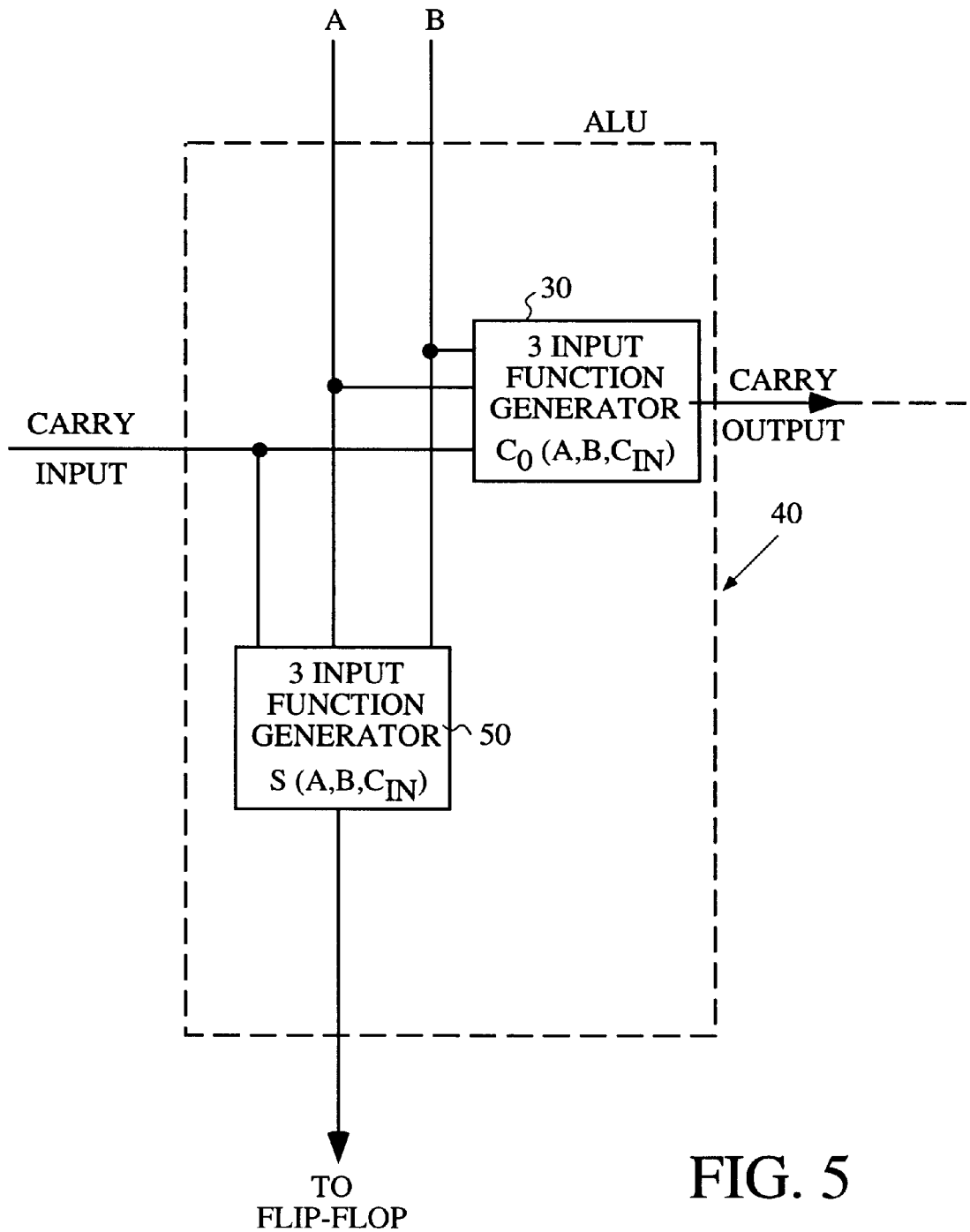
FIG. 5 is a block diagram of one embodiment of the present invention.

FIG. 5 provides a generalized view of the improved configurable ALU unit with configurable carry of the present invention. The prior art, carry cell 10 shown in FIGS. 3 and 4 is replaced by configurable carry cell 30 (shown in FIG. 5) which can be configured for any desired compatible circuit element, either as a logical function generator or as an arithmetic link from the ALU unit 40 to other ALU units in other macrocells. In one embodiment shown in FIG. 5, configurable carry cell 30 comprises a 3-input lookup table, although the size and complexity of the unit can be expanded or contracted depending upon the user's needs and the space available on the integrated circuit device for the desired function. Arithmetic block 50 in FIG. 5 also includes a 3-input lookup table, however, there is no need for consistency in the size and complexity of blocks 30 and 50 within unit 40. Appropriate configuration bits (not shown) are attached to block 30 for configuring the carry cell unit as desired.

Using the diagram of FIG. 5 as a basic block to build highly functional circuits, we will refer to FIGS. 6–10 for examples of how the improved configurability of the present invention generates both logical and arithmetic functions.

Figure 6:
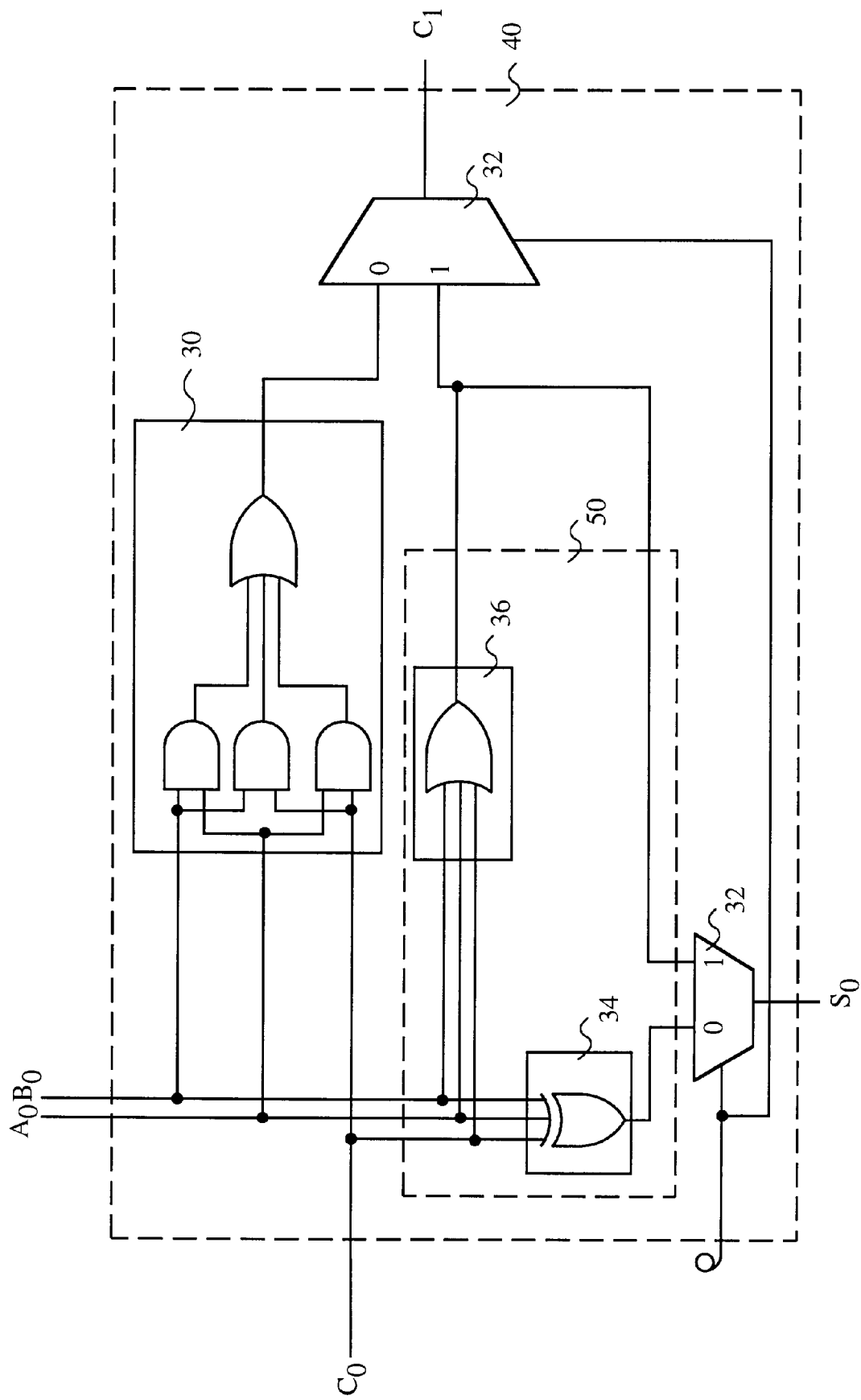
FIG. 6 is a simplified diagram of a second embodiment of the present invention.

FIG. 6 provides a first example of a desirable circuit configuration enabled by the added configurability of the circuit of the present invention. A basic adder circuit is expanded to allow for tiered O Ring of input bits $A_0$ and $B_0$ and carry input $C_0$. It should be noted that the functions of blocks 30 and 50 could be easily interchanged if desired. Multiplexers 32 allow block 30 and XOR function 34 to be bypassed in favor of OR function 36.

Figure 7:
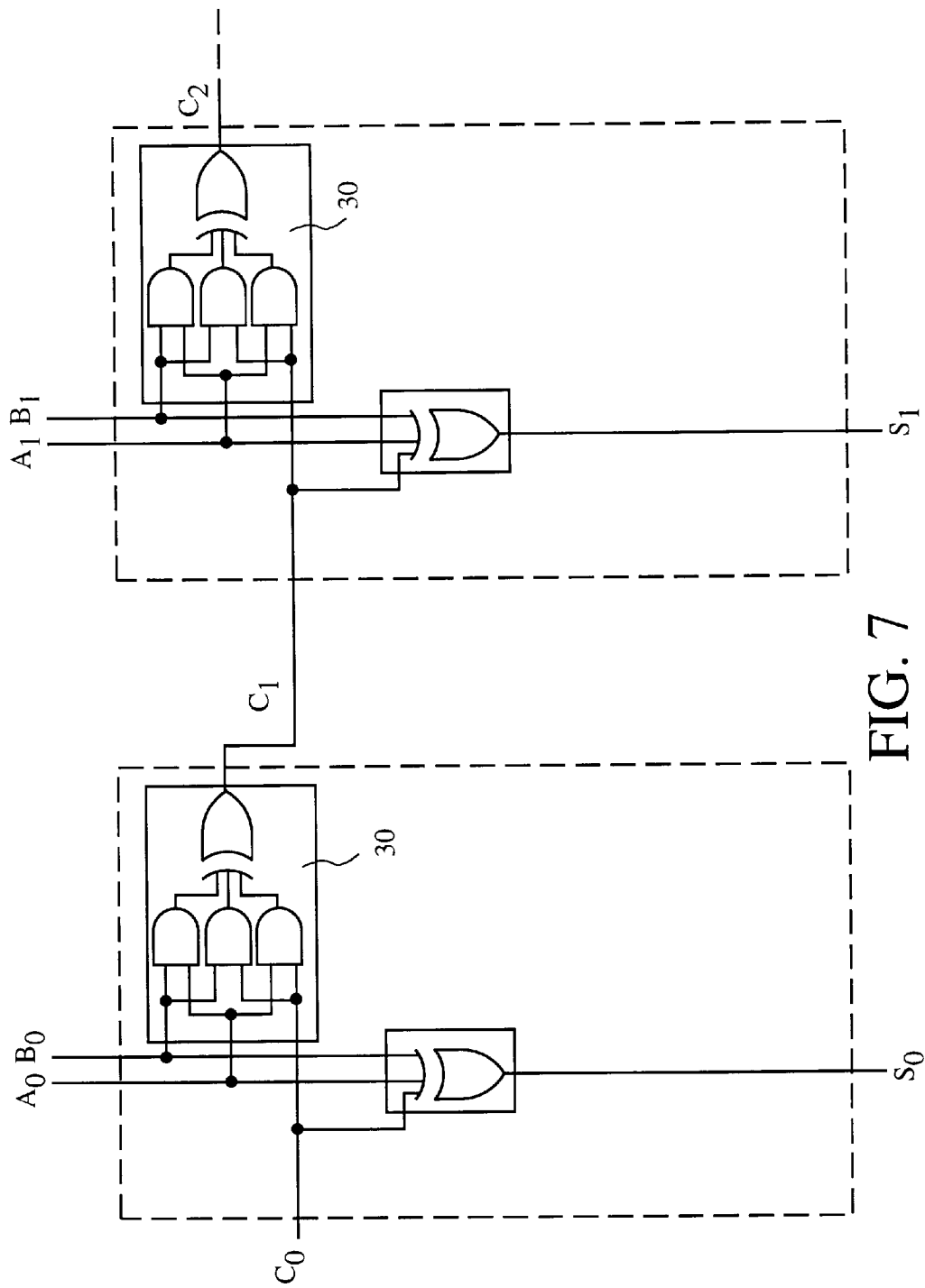
FIG. 7 provides a first example configuration utilizing the improved configurability of the present invention.

FIG. 7 illustrates a full-adder configuration of the circuit of the present invention. Output signal $C_1=A_0B_0+B_0C_0+A_0C_0$ and output signal $S_0=A_0(+)B_0(+)C_0$. Thus, the circuit of the present invention may be configured in a manner similar to available full adder circuits and can meet and exceed the needs of users of existing EPLDs.

Figure 8:
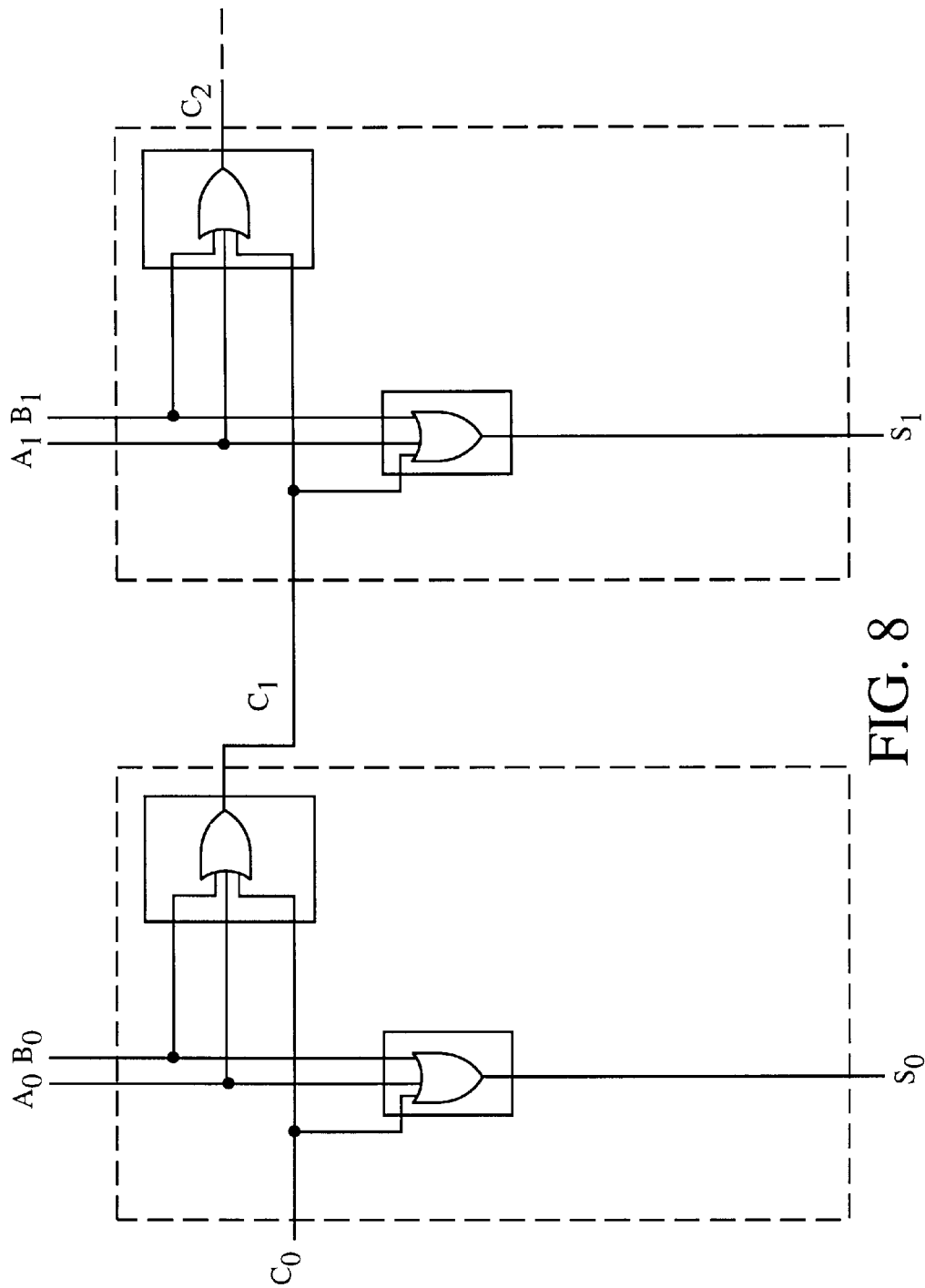
FIG. 8 provides a second example configuration utilizing the improved configurability of the present invention.

In a specific embodiment of the present invention, a carry function can be selected that cascades the product terms of any number of macrocells. Thus a very wide OR function is provided, potentially using as many product terms as are available on a given device. Each macrocell provides a smaller OR function for a subset of the wide OR ultimately provided. The carry chain is then used to provide a second tier of ORs that cascade all of the macrocells' solutions. FIG. 8 illustrates execution of an OR function with arbitrarily large fan-in available for scanning a number of bits through an EPLD. In FIG. 8, $S_1=A_0+B_0+A_1+B_1$, and so on for n units until $S_{n-1}=A_{n-2}+B_{n-2}+A_{n-1}+B_{n-1}$.

Figure 9:
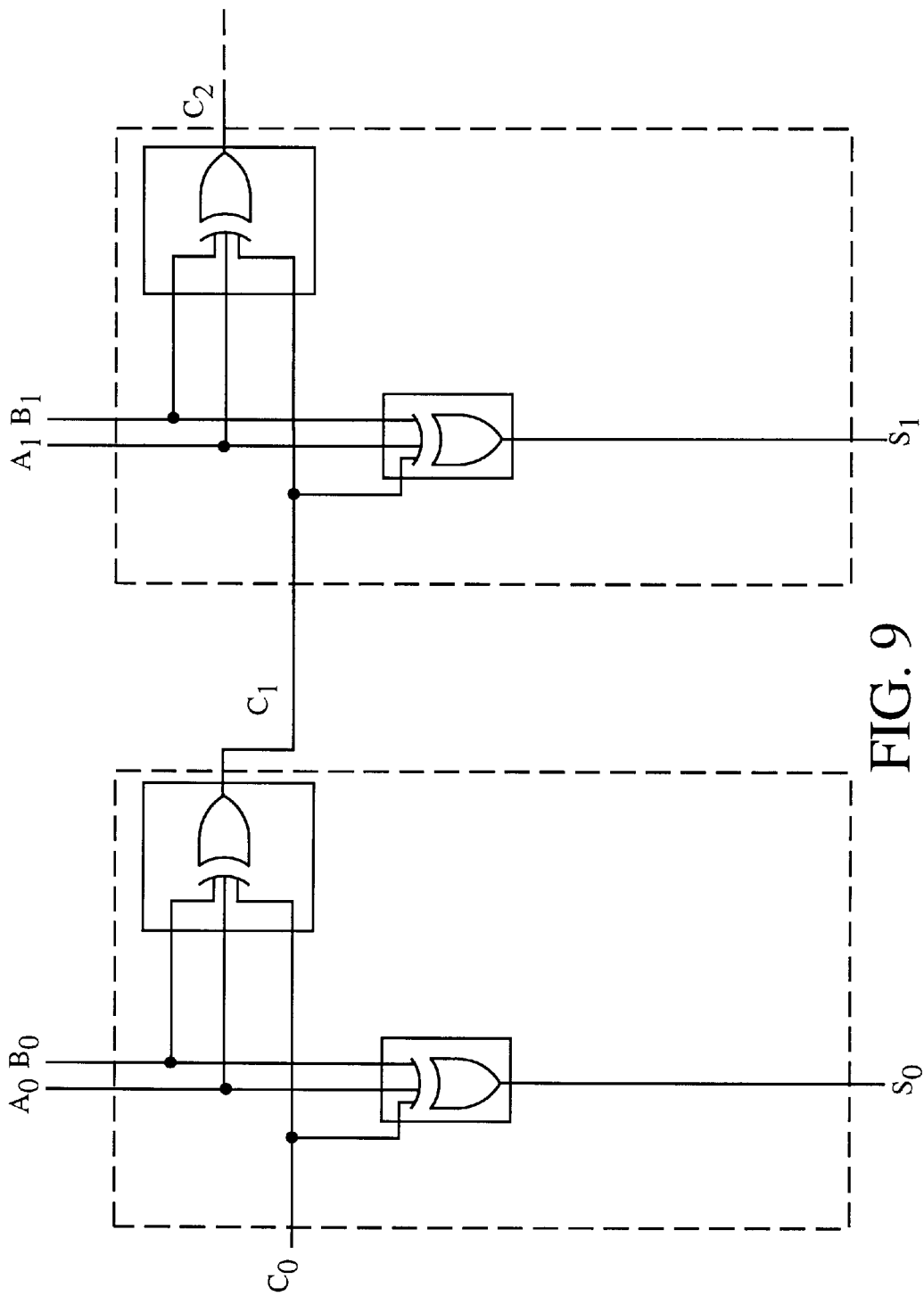
FIG. 9 provides a third example configuration utilizing the improved configurability of the present invention.
Figure 10:
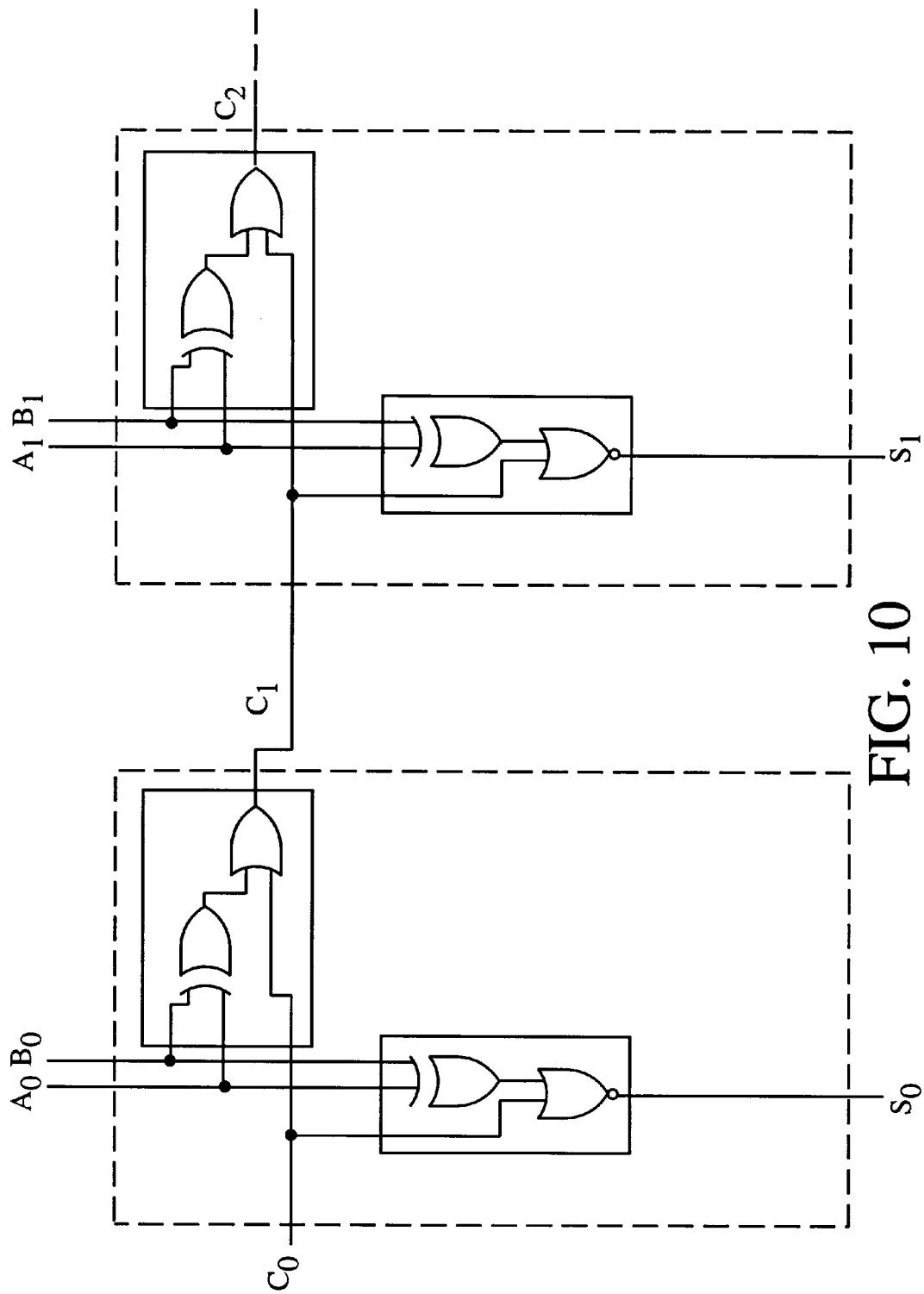
FIG. 10 provides a fourth example configuration utilizing the improved configurability of the present invention.

FIG. 9 illustrates the circuit of the present invention configured to perform a parity function wherein each carry bit $C_n$ is logic high only if there is an odd number of "1"s among bits A, B, and the previous carry bit $C_{n-1}$. Finally, FIG. 10 illustrates an equality comparator circuit design for determining whether all bits $A_n$ and $B_n$ have the same value.

Thus, it can be seen that flexible and programmable function generator substituted for the prior art hard-wired EPLD carry block provides a demonstrable improvement in circuit functionality without compromising existing ALU functionality. While configurable carry blocks with more than 3-bit input signals would require greater device resources within the macrocell architecture, some users may appreciate or require the greater flexibility in allowing local computation of more complex logical relationships between input bits.

While the present invention has been described with reference to certain preferred embodiments, those skilled in the art to which the present invention pertains will now, as a result of the applicant's teachings herein, recognize that various modifications and other embodiments may be provided. By way of example, the precise structure of the programmable carry cell may be modified while preserving the advantages of the increased configurability and resources of the invention. These and other variations upon and modifications to the embodiment described herein are deemed to be within the scope of the invention which is to be limited only by the following claims.

We claim:

1. An arithmetic logic unit in a logic block of a programmable logic device comprising an array of logic blocks, said logic block receiving a plurality of input signals $A_0$, $B_0$, and $C_0$, said arithmetic logic unit comprising:

an input terminal for receiving said plurality of input signals;

a first programmable function generator connected to said input terminal and including first processing means for processing said plurality of input signals, and for selectively generating an output signal $S_0$ in accordance with the Boolean equation $S_0 = A_0(+) B_0(+) C_0$;

first means for programming said first processing means;

a second programmable function generator connected to said input terminal and including second processing means for processing said plurality of input signals, and for selectively generating an output signal C1 in accordance with the Boolean equation $C_1 = A_0 B_0 + B_0 C_0 + A_0 C_0$;

second means for programming said second processing means.

* * * * *